United States Patent [19]

Sanders et al.

[11] 4,077,016
[45] Feb. 28, 1978

[54] APPARATUS AND METHOD FOR INHIBITING FALSE LOCKING OF A PHASE-LOCKED LOOP

[75] Inventors: David E. Sanders, St. Petersburg; Ramon P. Chambers, Clearwater; Robert S. Gordy, Largo, all of Fla.

[73] Assignee: NCR Corporation, Dayton, Ohio

[21] Appl. No.: 770,557

[22] Filed: Feb. 22, 1977

[51] Int. Cl.² .................... H03B 3/04; H03D 3/00
[52] U.S. Cl. ...................................... 331/4; 329/122; 331/19; 331/23; 331/25
[58] Field of Search .................. 331/4, 19, 23, 25; 329/50, 122, 124, 125; 325/419, 346, 423

[56] References Cited

U.S. PATENT DOCUMENTS 3,768,030  10/1973  Brown et al. ................. 331/17 X
3,810,036  5/1974   Bloedorn ..................... 331/17 X
4,000,476  12/1976  Walker et al. ................. 331/4 X Primary Examiner—Siegfried H. Grimm
Attorney, Agent, or Firm—J. T. Cavender; Edward Dugas

[57] ABSTRACT

Apparatus and method are provided to discriminate between true locking of a phase-locked loop on the main lobe of an information signal, and false locking on a side lobe thereof. The energy in the locked signal is sensed and compared with the signal energy at fixed frequency increments, preferably twice the bit clock rate frequency, above and below the lock frequency. A greater energy content at the increment frequencies than at the locked frequency indicates a false lock condition and is used to inhibit the loop from entering a locked mode.

21 Claims, 10 Drawing Figures

FIG. 1A
FIG. 1B
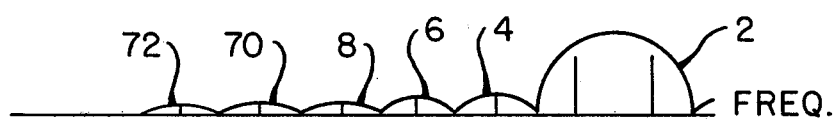
FIG. 1C
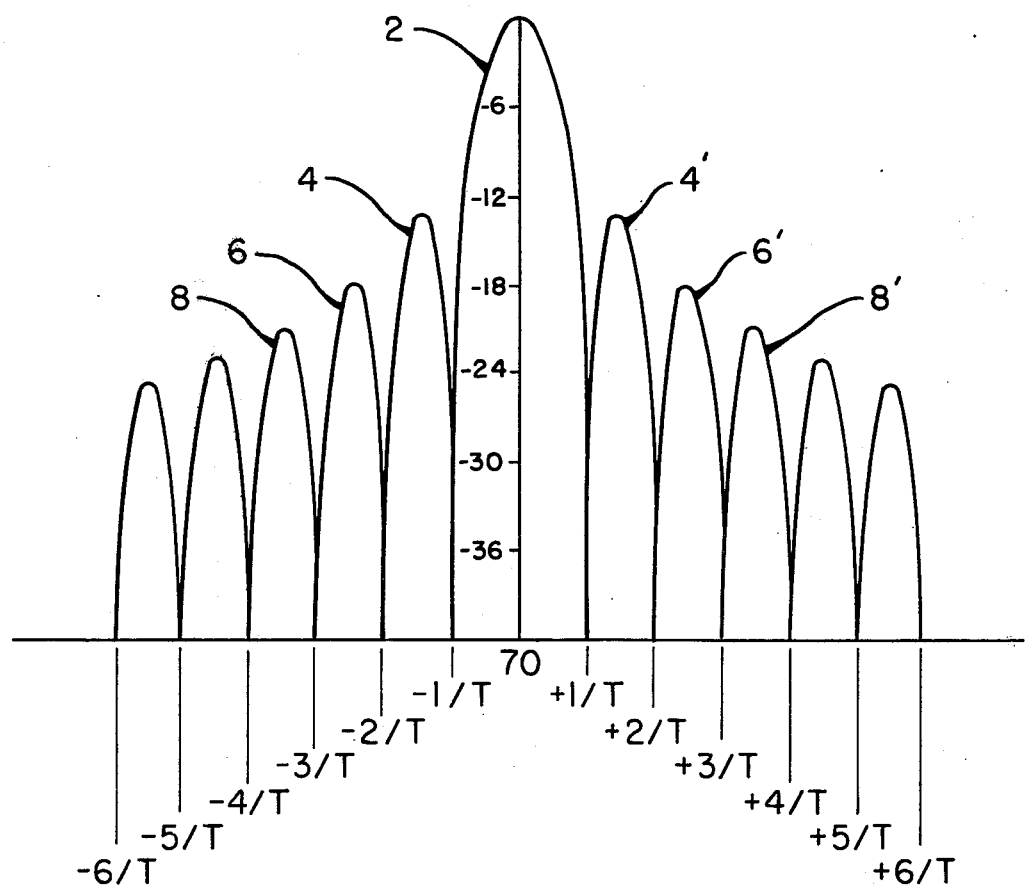
FIG. 2  DB POWER SPECTRUM

APPARATUS AND METHOD FOR INHIBITING FALSE LOCKING OF A PHASE-LOCKED LOOP

BACKGROUND OF THE INVENTION

Field of the Invention

The present invention relates to electronic circuitry, and more particularly, to a circuit for inhibiting a phase-locked loop from locking on any lobe of an input signal other than the main lobe.

Description of the Prior Art

A phase-locked loop is basically a servo system in which a voltage controlled oscillator (VCO), having a center frequency determined by an external timing capacitor and resistor, produces an output signal which is compared with an incoming information signal. An error correction voltage is produced, the magnitude of which is a function of the phase and frequency differences between the compared signals. After processing, the error correction signal is fed back to the VCO to complete the loop and cause the VCO frequency to approach the frequency of the input signal. The VCO initially assumes a "capture" state in which it traverses the frequency range of the loop under the influence of a sweep generator, continually testing the input signal and having its own frequency adjusted accordingly. As it approaches the input signal frequency, the VCO frequency continues to change until it is within a small bandwidth of the signal frequency. Thereafter, the VCO stops sweeping and its output matches the input frequency, thereby permitting extraction of the information contained in the input signal at a very favorable noise level.

For many input signals such as phase shift key, there is an undesired carrier offset due to factors such as Doppler shifts and oscillator instability. Under such conditions it is necessary to sweep the frequency of the VCO to search out and lock on the incoming signal. Should the carrier offset be so great that the main signal lobe is outside the VCO sweep range, the loop will generally lock onto one of the side or harmonic lobes within its range. Since the amplitudes of adjacent side lobes do not differ from each other by a great amount, the loop will often lock onto the first lobe it comes across which has a sufficient signal to noise ratio. When this condition occurs, which may be denominated a false lock because the main signal lobe has not been detected, sweeping is discontinued and the loop tracks the side lobe. Even when the main lobe is within the sweep frequency range, it is still possible for the loop to lock on a side lobe if the sweep rate is not very high and the side lobe is not very noisy. The problem is especially acute during short periodic modulation sequences, such as an alternating one-zero pattern commonly used for initial lockup.

Accordingly, there is a need for a phase-locked loop which is capable of discriminating between the main and side lobes of an input signal.

SUMMARY OF THE INVENTION

In view of the above problems associated with the prior art, the principal object of the present invention is the provision of a novel and improved circuit for inhibiting a phase-locked loop from locking on input signal frequencies other than the main signal lobe.

Another object is the provision of a novel and improved phase-locked loop in which locking is permitted only when the loop has located the highest energy portion of an incoming signal, and is inhibited at other times.

Another object is the provision of a novel and improved method for operating a phase-locked loop such that VCO sweeping is terminated only when the loop has locked on the main lobe of an input signal.

These and other objects are realized according to the present invention by the provision of a circuit which senses the input signal energy at a test frequency within the loop range, and at a pair of second frequencies, the second frequencies being equal increments respectively greater and less than the test frequency. The circuit includes means to compare the sensed signal energies, and to inhibit the loop from locking when the energy at the second frequencies exceeds that of the test frequency.

In a preferred embodiment a bit rate clock circuit is associated with the phase-locked loop and produces a signal having a frequency equal to the differential between adjacent side lobes of the loop input signal. The second frequencies differ from the test frequency by a whole number multiple of the bit rate clock frequency, the multiple preferably being two. The energy comparison is achieved by multiplying the input signal, after processing through a phase detector, by twice the bit rate clock frequency so as to cause a frequency shift of the input signal. The original and shifted input signals are then compared by directing each signal through filters and opposite-polarity rectifier circuits to opposed ends of a resistance element. An intermediate tap on the element is connected to a threshold sensing means which produces an inhibit signal preventing the loop from locking when compared signals indicate a side lobe energy greater than the energy level at the test frequency.

The invention also includes the method of preventing false locking of a phase-locked loop by sensing the energy content at a test frequency of the loop input signal and at additional frequencies equal increments greater and less than the test frequency, comparing the sensed energies, and inhibiting the loop from locking when the energy of the test frequency is less than at the other frequencies.

DESCRIPTION OF THE DRAWINGS

These and other objects of the present invention will be apparent to those skilled in the art from the ensuing detailed description thereof, together with the accompanying drawings, in which:

FIGS. 1A, 1B and 1C are respectively graphical representations of the frequency spectrum capture range of a phase-locked loop, of an input signal with its main lobe within the capture range, and of an input signal with its main lobe outside the capture range;

FIG. 2 is a logarithmic graph of the power spectrum of a typical input signal;

DETAILED DESCRIPTION OF A PREFERRED EMBODIMENT

The capture range of a typical phase-locked loop employed in connection with the transmission of phase shift key signals is shown in FIG. 1A as being centered at 70 MHz and extending for about 1 KHz to either side in the frequency spectrum. This capture range is determined by a bandpass filter in the loop circuit which is designed to have a passband narrow enough to limit the transmission of noise into the loop. The exact band selected will generally be determined by a trade-off between signal to noise ratio in the loop and loop lockup time.

Both the bandwidth and the center frequency, of course, will be determined by the requirements of the particular system under consideration.

A typical phase shift key input signal to the loop is shown in FIG. 1B immediately below the capture range graph. In this figure, the input signal is centered on the middle of the passband and extends symmetrically to each side thereof. The input signal comprises a main lobe 2, a plurality of side lobes 4, 6 and 8 of progressively decreasing frequencies, and a symmetrical plurality of side lobes 4', 6' and 8' of progressively increasing frequencies. Approximately ninety percent of the energy is contained in main lobe 2, and about five percent of the energy in the first side lobes 4 and 4'. The remaining signal energy is distributed among the other side lobes in decreasing amounts as the distance from the main lobe increases. The various lobes represent the spectrum of a pseudo random sequence modulation, while the vertical lines within the lobes represent spectrum of an alternating one-zero modulation pattern.

FIG. 2 is a logarithmic diagram illustrating a typical power spectrum (in db) for an input signal. In this figure, the side lobes each span a frequency interval of 1/T, with T being the period of the bit rate clock employed in demodulating the input signal to extract its information content.

Referring back to FIG. 1A, the center of the passband is set equal to the nominal input signal carrier frequency presented to the bandpass filter. When the input signal is centered within the passband as shown, the phase-locked loop will generally operate in the desired manner and lock on the center of main lobe 2. A false lock condition, i.e., a lock on a side lobe rather than main lobe 2, will generally occur when the main lobe is offset from the passband, as illustrated in FIG. 1C. In this situation the loop will search the passband range and lock on the first side lobe it encounters having a sufficient signal to noise ratio. A false lock can also occur should main lobe 2 be offset from, but still within the passband, if the noise level is sufficiently low.

Figure 3:
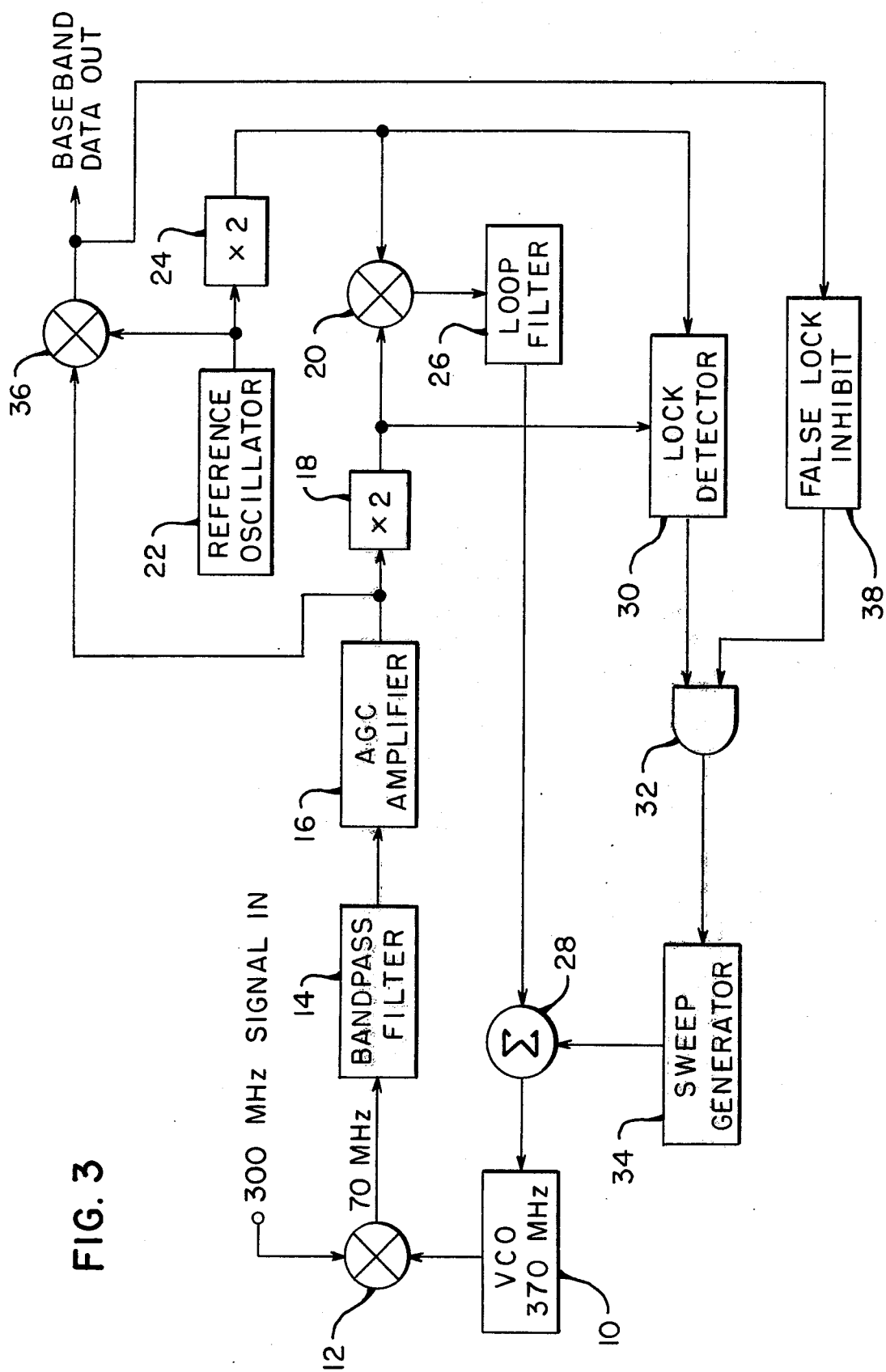
FIG. 3 is a block diagram of a phase-locked loop circuit employing the present invention.

Referring now to FIG. 3, a typical phase-locked loop is shown in block diagram format. Except for the false lock inhibitor feature to be described hereinafter, the loop is of a type well known in the art. Further information on phase-locked loops and associated modulation schemes may be obtained from references such as the following: Lindsey and Simon, "The Performance of Suppressed Carrier Tracking Loops in the Presence of Frequency Detuning", Proceedings of the I.E.E.E., Volume 58, No. 9, September, 1970, pages 13 and 15-21; P. H. Young, "To Detect Signals Buried in Noise", Electronic Design 12, June 10, 1971; and, Lindsey and Simon, "Telecommunications System Engineering", Prentice Hall, 1973. The contents of the above publications relating to phase-locked loop systems are incorporated herein by reference.

The loop includes a voltage controlled oscillator (VCO) 10, the output of which is mixed with the incoming signal in mixer 12. Assuming a 300 MHz nominal carrier frequency for the input signal and a VCO center frequency of 370 MHz, the input signals of FIGS. 1B and 1C, nominally centered at 70 MHz, will be delivered from mixer 12 to the remainder of the loop. Connected in series with the mixer output is a bandpass filter 14 having a response characteristic as shown in FIG. 1A, and an automatic gain control amplifier 16 which establishes a constant power level for the filtered signal. The amplifier output is multiplied by two in multiplier circuit 18 to remove the signal's phase modulation, and phase compared in phase detector 20 with a signal from 70 MHz reference oscillator 22, the latter signal having been multiplied in frequency by two in multiplier circuit 24. The output of phase detector 20 provides an error voltage signal for loop control, which signal is filtered in low pass filter 26 to remove noise and set the desired loop bandwidth. The error signal from filter 26 passes through a summer 28 and is used to control the operating frequency of VCO 10.

The output signals from multiplier circuits 18 and 24 are also fed to lock detector circuit 30, which produces a logic "1" signal when the loop has locked on an input signal, and a logic "0" signal when the loop is unlocked. The logic output of lock detector 30 is connected to one input terminal of an AND gate 32, the output of which controls a sweep generator 34. Operation of the sweep generator is initiated and terminated respectively by "0" and "1" signals from AND gate 32. During an unlocked condition a sweep voltage from generator 34 is added to the loop control voltage in summer 28, causing VCO 10 to sweep in frequency. When the loop has properly locked on an input signal, sweep generator 34 is turned off and VCO 10 is controlled by the loop control voltage alone.

In order to extract the information content from the input signal, the outputs of automatic gain control amplifier 16 and reference oscillator 22 are connected to a phase detector 36 which demodulates the input signal to baseband data. This data in turn may be processed by a bit timing loop having a clock rate equal to the frequency differential between successive harmonic lobes of the input signal, and by appropriate data processing apparatus.

With the exception of AND gate 32, the circuit described thus far is conventional. The improvement provided by the present invention involves a false lock inhibit circuit 38 which is connected in the loop to receive inputs from phase detector 36. The output of circuit 38 is connected to the other terminal of AND gate 32 such that a stop-sweep signal is delivered to sweep generator 34 only during the simultaneous presence of a lock signal from lock detector 30, and a true lock signal from inhibit circuit 38 indicating the loop has locked on the main signal lobe rather than a side lobe thereof.

Figure 4:
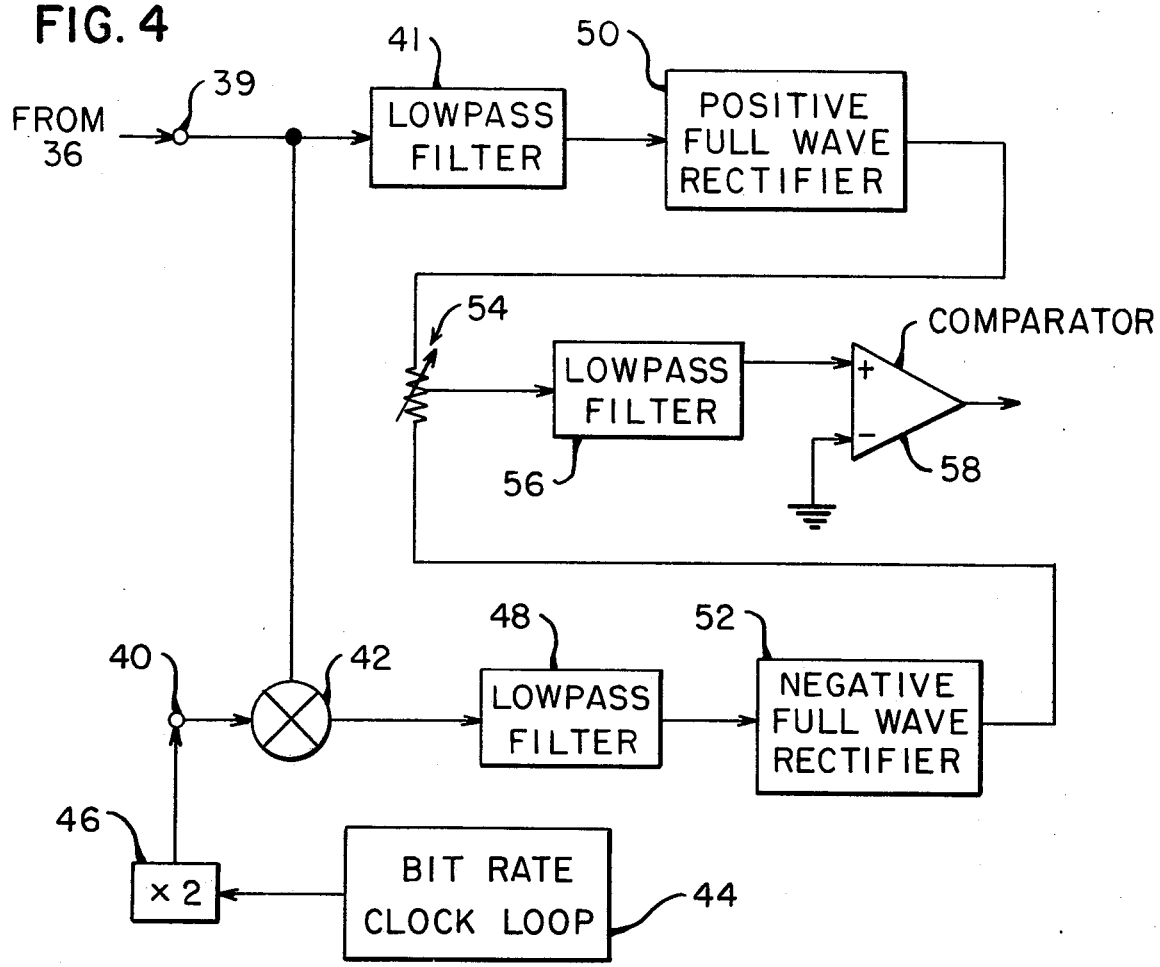
FIG. 4 is a block diagram of a false lock inhibit circuit employed in the circuit of FIG. 3.

A block diagram of false lock inhibit circuit 38 is shown in FIG. 4. The circuit includes first and second input terminals 39 and 40, respectively. The signal from phase detector 36 is delivered through input terminal 39 to a low pass filter 41 having a cut-off frequency of about three-fourths the bit rate clock frequency. In addition, input terminal 39 is connected as a first input to a mixer 42 which receives a second input through input terminal 40 from the bit rate timing loop 44. The latter signal is multiplied to twice the bit rate clock frequency by multiplier circuit 46.

The output of mixer 42 is connected to a low pass filter 48 having essentially the same cut-off frequency as filter 41. The outputs of filters 41 and 48 are connected respectively to positive and negative full-wave rectifiers 50 and 52, and from there to opposite ends of a resistive potentiometer 54. The variable intermediate tap 55 of the potentiometer is adjusted for a desired comparison level between the signals from rectifiers 50 and 52, and connected to a low pass filter 56 for improvement of the signal noise ratio. The output of filter 56, in turn, is connected to a comparator 58, which compares the received signal with ground and produces a logic "1" signal if the received signal exceeds a certain threshold which indicates that the positive voltage signal from rectifier 50 is greater in magnitude than the negative voltage signal from rectifier 52. If the potentiometer element is linear and tap 55 located at its center, the threshold level ideally would be ground, or somewhat greater to allow for noise. The output of comparator 58 is the false lock inhibit signal which is delivered to AND gate 32.

Figure 5A:
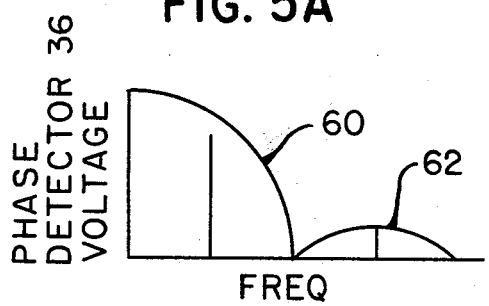
FIGS. 5A and 5B are graphical representations in the frequency spectrum of the signals generated and compared to determine the presence of a false lock condition, for a condition in which the input signal is centered on the nominal carrier frequency.
Figure 5B:
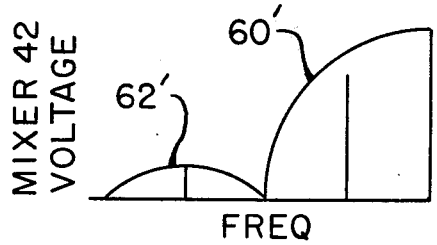

The manner in which false lock inhibit circuit 38 operates to prevent the loop from locking on a side lobe will now be described. Assuming first that the center of the main lobe of the input signal is within the loop capture range, i.e., at the middle of the filter 14 passband of FIG. 1A, the output voltages of phase detector 36 and mixer 42 will be as shown in FIGS. 5A and 5B, respectively. In FIG. 5A, the large lobe 60 beginning at DC is proportional to the energy in main lobe 2, while the smaller lobe 62 is proportional to the energy in primary side lobes 4 and 4'. In FIG. 5B the spectrum for mixer 42 has essentially been shifted by twice the bit rate clock frequency and flipped over about the voltage axis, resulting in a smaller lobe 62' beginning at DC followed by a larger lobe 60'. At DC the output voltage of phase detector 36 is relatively high, indicating a high energy content, whereas the output voltage of mixer 42 is quite low or 0, indicating a low energy content. Accordingly, the voltage output of positive rectifier 50 will be much greater in absolute value than the negative voltage output of negative rectifier 52, and a positive signal will be delivered to comparator 58. That element, in turn, delivers a logic "1" signal to AND gate 32, permitting the transmission of a signal from lock detector 30 to turn off the sweep generator.

It is an important feature that, by mixing the signal from phase detector 36 with a signal having a frequency twice the bit rate clock frequency, a signal is obtained from mixer 42 for comparison with the phase detector 36 signal which is shifted in frequency from the phase detector signal by half the main lobe and one full side lobe. This results, for true lock conditions, in one of the compared signals (from phase detector 36) having a maximum value and the other compared signal (from mixer 42) having essentially zero value. This maximum differential between the compared signals makes the detection of a true lock quite reliable. The same advantage would also be obtained by mixing the phase detector signal with a signal having a frequency which is another whole number multiple of the bit rate clock frequency. Multiples greater than 2, however, would tend to unnecessarily extend the frequency range of the inhibit circuit, and could result in a failure to detect a false lock if the increments are so large that they extend on one side to a lower energy lobe on the other side of the main lobe. On the other hand, a multiple of one would reduce the differential between the compared signals for a false lock condition and thereby possibly lower the accuracy of the inhibit circuit.

Figure 6A:
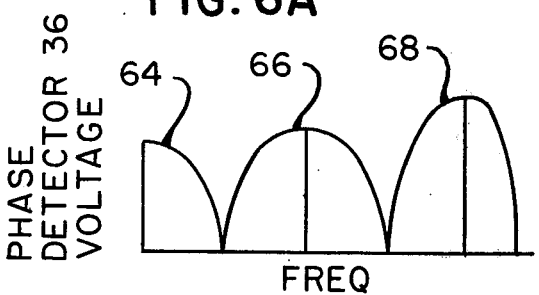
FIGS. 6A and 6B are graphical representations similar to FIGS. 5A and 5B of the compared signals, for a condition in which the input signal is offset from the nominal carrier frequency and the loop is attempting to enter a false lock state.
Figure 6B:
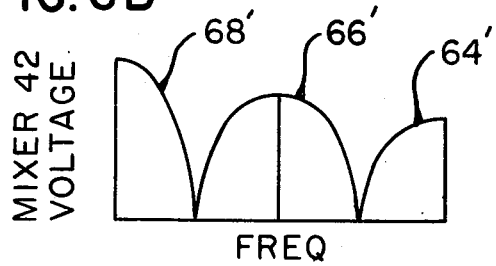

The operation of the inhibit circuit for a false lock condition will now be described. Assume that the loop has locked on side lobe 8 of the input signal shown in FIG. 1C. In this situation, the output frequency of phase detector 36 will be as shown in FIG. 6A, with three voltage lobes 64, 66, and 68 progressively increasing in magnitude away from DC. The magnitudes of lobes 64, 66, and 68 are proportional to the energy in input signal lobe 8, in immediately adjacent input signal lobes 6 and 70, and in next adjacent input signal lobes 4 and 72, respectively. The output of mixer 42 is reversed and shifted in frequency from that of phase detector 36, as shown in FIG. 6B. Here the higher energy content of side lobes 4 and 72 appears as a relatively high magnitude lobe 68' beginning at DC, while the lower energy content of side lobe 8 appears as the relatively low magnitude lobe 64' furthest removed from DC.

When a false lock condition occurs, the voltage from mixer 42 exceeds the voltage from phase detector 36, producing a negative output signal from potentiometer 54. Comparator 58 produces a "0" logic output which, accordingly, disables AND gate 32 and thereby inhibits the discontinuance of VCO sweeping.

It should be evident from the above discussion that the energy content of the input loop signal steadily decreases away from the center of the main lobe. Thus, in case of a false lock on a side lobe, the described comparison between the energy content at the locked side lobe and at predetermined frequency increments greater and less than the locked frequency reveals a lesser energy content from the locked lobe. On the other hand, since the input signal energy is greatest at the main lobe, should the energy comparison between the locked lobe and side lobes thereof reveal a higher energy content for the locked lobe, this information is sufficient to make a determination that a correct lock on the main lobe has occurred. Accordingly, the present invention may be generalized to include the detection and prevention of a false lock by comparing the signal energy at the lock frequency with the signal energy at equal frequency increments greater and less than the locked frequency, and inhibiting the loop from locking when the first signal energy is less than the second.

While a particular embodiment of the invention has been shown and described, numerous variations and modifications are possible in light of the above teachings. It is, therefore, intended that the scope of the invention be limited only in and by the terms of the appended claims.

What is claimed is:

1. In a phase-locked loop circuit adapted to sweep a predetermined frequency range for an input signal within said range and lock on a detected input signal, said input signal being characterized in the frequency spectrum by a relatively high energy main lobe and relatively low energy side lobes, the improvement comprising a false lock inhibit circuit adapted to inhibit the loop from locking on a side lobe of an input signal, said inhibit circuit comprising:

circuit means for sensing the input signal energy at a test frequency within said frequency range and at a pair of second frequencies, said second frequencies being substantially equal increments respectively greater and less than the test frequency;

means for comparing the sensed energies; and means for inhibiting locking of said loop circuit when the energy at the second frequencies exceeds the test frequency energy.

2. The phase-locked loop circuit of claim 1, said circuit means being adapted to sense the input signal energy at second frequencies which differ from the test frequency by a substantially whole number multiple of the frequency spanned by individual side lobes.

3. The phase-locked loop circuit of claim 2, said multiple being two.

4. The phase-locked loop circuit of claim 1, wherein said energy sensing circuit means includes an input circuit for delivering a detected input signal to said comparison means, means for shifting the input signal frequency spectrum by an amount equal to the differential between the test frequency and each of said second frequencies, and circuit means providing a path to connect the shifted signal to said comparison means for comparison with said input signal.

5. The phase-locked loop circuit of claim 4, further comprising a phase detector means connected to receive said input signal and to deliver an output signal in response thereto, and an oscillator means providing a reference for said phase detector means, the output of said phase detector means being connected to provide the input signal for said energy sensing circuit means.

6. The phase-locked loop circuit of claim 4, said input and signal shifting circuits including rectifier means of opposite polarities, respectively, for rectifying their respective signals before delivery thereof to said comparison means.

7. The phase-locked loop circuit of claim 6, said comparison means including a resistance means having opposite end terminals connected to receive signals respectively from said input and signal shifting circuits, and an intermediate terminal for providing a signal indicative of the relative energies in said input and shifted signals.

8. The phase-locked loop circuit of claim 1, further comprising means for sweeping the loop frequency range to lock on an input frequency and means for detecting when the loop has locked, said lock detecting means being connected in circuit to disable said sweep means in response to the detection of a lock, wherein said false lock inhibit circuit is connected to interrupt the circuit connection between said lock detecting means and said sweep means when the energies at said second frequencies exceed the test frequency energy, and thereby to inhibit said sweep means from being disabled during false lock conditions.

9. The phase-locked loop circuit of claim 8, said false lock inhibit circuit and lock detector each being connected to respective terminals of a logic gate the output of which is connected to said sweep means, said gate being adapted to deliver a disabling signal to said sweep means only during receipt of a lock signal from said lock detector and the absence of a false lock signal from said inhibit circuit.

10. In a phase-locked loop circuit having a sweep means adapted to sweep a predetermined frequency range to lock on the main lobe of an input signal within said range, a phase detector adapted to produce an output data signal representative of the input signal, and an associated bit rate clock means, said input signal being characterized in the frequency spectrum by a relatively high energy main lobe and relatively low energy side lobes, said bit rate clock means having an output frequency substantially equal to the frequency differential between adjacent side lobes of the input signal, the improvement comprising a false lock inhibit circuit adapted to inhibit the loop from locking on a side lobe of the input signal, said inhibit circuit comprising:

first and second input terminals connected respectively to receive the output of said phase detector and a signal related to the output of said bit rate clock means;

a signal mixing means connected to receive and mix signals from said first and second input terminals;

a two-input comparison means adapted to produce an output signal indicative of the higher energy one of its inputs;

said first input terminal and the output of said signal mixing means being connected respectively as inputs to said comparison means; and means for inhibiting locking of said loop circuit in response to said comparison means output indicating a greater signal energy level at the output of said signal mixing means than at said first input terminal.

11. The phase-locked loop circuit of claim 10, further comprising means for multiplying the frequency of the bit rate clock signal by a whole number multiple prior to delivery to said second input terminal.

12. The phase-locked loop circuit of claim 11, said whole number multiple being two.

13. The phase-locked loop circuit of claim 11, further comprising positive and negative rectifier means, one of said rectifier means being connected in circuit between said first input terminal and said comparison means, and the other of said rectifier means being connected in circuit between said signal mixing means and said comparison means.

14. The phase-locked loop circuit of claim 13, further comprising low pass filter means connected in circuit between each of said rectifier means and said first input terminal and signal mixing means, respectively.

15. The phase-locked loop circuit of claim 13, said comparison means including a resistance means connected in circuit between the outputs of said positive and negative rectifier means, an output tap connected to an intermediate portion of said resistance means whereby the signal on said tap exceeds a predetermined threshold level when the signal energy from the positive rectifier means exceeds the signal energy from the negative rectifier means, and a threshold sensing means connected to receive a signal related to the tap signal and adapted to produce an output logic signal in response thereto, said output logic signal being indicative of which of the input signals has the higher energy level.

16. The phase-locked loop circuit of claim 15, said loop including lock detector means adapted to produce a logic output signal indicating a locked state, and circuit means connecting said lock detector means with said sweep means to disable said sweep means in response to the detection of a lock, wherein said false lock inhibit circuit includes a logic gate having first and second inputs respectively from said lock detector means and said threshold sensing means, and an output connected to said sweep means, said gate adapted to inhibit the transmission of a disabling signal from said lock detector to said sweep means when the logic output of said threshold sensing means indicates a higher energy level at the output of the signal mixing means than at the first input terminal.

17. The method of preventing a phase-locked loop circuit from falsely locking on a side lobe of an input signal, said signal being characterized by a relatively high energy main lobe and relatively low energy side lobes, and said loop circuit adapted to sweep a frequency range and test at a plurality of test frequencies for the input signal within said range, comprising, for each test frequency:
   sensing the input signal energy at the test frequency;
   sensing the input signal energy at substantially equal frequency increments above and below the test frequency;
   comparing the sensed signal energies; and
   inhibiting the loop from locking when the energy sensed at the test frequency exceeds the energy sensed at the increment frequencies.

18. The method of claim 17, said frequency increments being substantially whole number multiples of the frequency spanned by individual side lobes of the input signal.

19. The method of claim 18, said multiple being two.

20. The method of operating a phase-locked loop circuit to lock on an input signal, said signal being characterized by a relatively high energy main lobe and relatively low energy side lobes, comprising:
   sweeping a voltage controlled oscillator through a frequency range to test for said input signal;
   comparing the oscillator signal with the input signal;
   generating an error correction voltage based upon said comparison when the oscillator signal differs from the input signal by more than a predetermined amount;
   controlling the oscillator output with said error correction voltage;
   detecting a locked condition when the oscillator signal differs from the input signal by less than said predetermined amount;
   terminating sweeping of the oscillator to lock on the input signal in response to the detection of a locked condition;
   sensing the input signal energy at the oscillator frequency and at frequencies greater and less than the oscillator frequency;
   comparing the sensed signal energies; and
   inhibiting the termination of sweeping when the energy sensed at the oscillator frequency is less than the energy sensed at the greater and lesser frequencies by a predetermined amount.

21. The method of claim 20 wherein the input signal energy is sensed at the test frequency, and at frequency increments above and below the test frequency which are substantially equal to twice the frequency spanned by individual side lobes of the input signal.

* * * * *